(12) United States Patent
Wu et al.

(10) Patent No.: US 8,772,214 B2
(45) Date of Patent: Jul. 8, 2014

(54) AQUEOUS CLEANING COMPOSITION FOR REMOVING RESIDUES AND METHOD USING SAME

(75) Inventors: Aiping Wu, Macungie, PA (US); Roberto John Rovito, Quakertown, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 1304 days.

(21) Appl. No.: 11/250,250

(22) Filed: Oct. 14, 2005

(65) Prior Publication Data

US 2007/0087949 A1  Apr. 19, 2007

(51) Int. Cl.
  *C11D 1/62*  (2006.01)
  *C11D 11/00*  (2006.01)
  *C11D 3/24*  (2006.01)

(52) U.S. Cl.
  CPC ............. *C11D 11/0047* (2013.01); *C11D 1/62* (2013.01); *C11D 3/245* (2013.01)
  USPC .......................................... 510/175; 510/176

(58) Field of Classification Search
  CPC ....... C11D 11/0047; C11D 1/62; C11D 3/245
  USPC .................................. 510/175, 176
  See application file for complete search history.

(56) References Cited

U.S. PATENT DOCUMENTS

| | | | |
|---|---|---|---|
| 5,709,756 A | 1/1998 | Ward et al. | |
| 5,780,406 A | 7/1998 | Honda et al. | |
| 5,855,811 A | 1/1999 | Grieger et al. | |
| 6,020,292 A | 2/2000 | Honda et al. | |
| 6,030,932 A | 2/2000 | Leon et al. | |
| 6,152,148 A | 11/2000 | George et al. | |
| 6,413,923 B2 | 7/2002 | Honda et al. | |
| 6,627,587 B2 | 9/2003 | Naghshineh et al. | |
| 6,677,286 B1 | 1/2004 | Rovito et al. | |
| 6,703,319 B1 | 3/2004 | Yates et al. | |
| 6,787,293 B2 | 9/2004 | Oowada et al. | |
| 6,825,156 B2 | 11/2004 | Lee et al. | |
| 7,199,091 B2 | 4/2007 | Takashima | |
| 2001/0001785 A1 | 5/2001 | Honda et al. | |
| 2001/0025017 A1 | 9/2001 | Amemiya et al. | |
| 2003/0099908 A1 | 5/2003 | Yokoi et al. | |
| 2004/0220065 A1* | 11/2004 | Hsu ................................ | 510/175 |
| 2004/0220066 A1 | 11/2004 | Rutter, Jr. | |
| 2004/0224866 A1* | 11/2004 | Matsunaga et al. ........... | 510/175 |
| 2005/0020091 A1 | 1/2005 | Fucsko et al. | |
| 2005/0176603 A1* | 8/2005 | Hsu ................................ | 510/175 |
| 2006/0154839 A1* | 7/2006 | Ilardi et al. .................... | 510/175 |
| 2006/0172905 A1* | 8/2006 | Rovito et al. ................... | 510/175 |
| 2007/0007196 A1 | 1/2007 | Komatsu et al. | |
| 2007/0060490 A1* | 3/2007 | Skee ............................... | 510/175 |

FOREIGN PATENT DOCUMENTS

| | | |
|---|---|---|
| CN | 1526807 A | 2/2004 |
| DE | 103 31 033 A1 | 1/2004 |
| EP | 0 678 571 A2 | 10/1995 |
| EP | 0 690 483 A2 | 1/1996 |
| EP | 0 853 335 A2 | 7/1998 |
| EP | 1 365 441 A1 | 5/2002 |
| EP | 1 318 432 A1 | 6/2003 |
| JP | 10-055993 | 2/1998 |
| JP | 2000-47401 A | 2/2000 |
| JP | 2002-202617 A | 7/2002 |
| JP | 2003-005388 | 1/2003 |
| JP | 2003-076037 A | 3/2003 |
| JP | 2004-122636 A2 | 4/2004 |
| JP | 2004-330056 A2 | 11/2004 |
| JP | 2005-150236 A2 | 6/2005 |
| JP | 2005-227749 A2 | 8/2005 |
| TW | 394793 B | 6/2000 |
| TW | 452886 B | 9/2001 |
| WO | WO 97/23588 | 7/1997 |
| WO | 00/14785 | 3/2000 |
| WO | 02/31072 A1 | 4/2002 |
| WO | 2005/043245 A2 | 5/2005 |
| WO | 2005043245 A2 | 5/2005 |
| WO | WO 2005/047422 A1 | 5/2005 |

* cited by examiner

*Primary Examiner* — Gregory Webb
(74) *Attorney, Agent, or Firm* — Rosaleen P. Morris-Oskanian; Anne B. Kiernan

(57) ABSTRACT

A composition and method for removing residues such as, without limitation, post etched and/or post ashed photoresist, plasma etching, ashing, and mixtures thereof from a substrate is described herein. In one aspect, there is provided a method for removing residues from a substrate comprising: contacting the substrate with a composition comprising: water; a quaternary ammonium hydroxide compound; a fluoride containing compound; and optionally a corrosion inhibitor wherein the composition is free of an added organic solvent and wherein the composition has a pH greater than 9.

20 Claims, No Drawings

AQUEOUS CLEANING COMPOSITION FOR REMOVING RESIDUES AND METHOD USING SAME

BACKGROUND

Numerous steps are involved in the fabrication of microelectronic structures. Within the manufacturing scheme of fabricating integrated circuits selective etching of different surfaces of the semiconductor is sometimes required. Historically, a number of vastly different types of etching processes, to selectively remove material, have been successfully utilized to varying degrees. Moreover, the selective etching of different layers, within the microelectronic structure, is considered a critical and crucial step in the integrated circuit fabrication process.

Increasingly, reactive ion etching (RIE) is the process of choice for pattern transfer during via, metal line and trench formation. For instance, complex semi-conductor devices such as advanced DRAMS and microprocessors, which require multiple layers of interconnect wiring, utilize RIE to produce vias, metal lines and trench structures. Vias are used, through the interlayer dielectric, to provide contact between one level of silicon, silicide or metal wiring and the next level of wiring. Metal lines are conductive structures used as device interconnects. Trench structures are used in the formation of metal line structures. Vias, metal lines and trench structures typically expose metals and alloys such as Al, Al/Cu, Cu, Ti, TiN, Ta, TaN, W, TiW, silicon or a silicide such as a silicide of tungsten, titanium or cobalt. The RIE process typically leaves a residue (of a complex mixture) that may include re-sputtered oxide material as well as possibly organic materials from photoresist and antireflective coating materials used to lithographically define the vias, metal lines and or trench structures.

Post RIE or other etch processing, plasma photoresist residue cleaning is typically conducted by ashing the patterned photoresist with a plasma containing a reactive agent typically activated reactive gas(es) such as without limitation, an oxygen-containing gas for oxidative processes or a hydrogen containing gas for reductive processes. Like the RIE process, plasma etch or plasma ash cleaning leaves a combination of residues including organic materials (e.g., residual photoresist, antireflective materials, and the like) and plasma etch related byproducts such as oxides or halides of titanium, copper, or related metals depending upon the plasma etch chemistry and substrate being treated.

It would therefore be desirable to provide a selective cleaning composition and process capable of removing residues such as, for example, residues resulting from selective etching using plasmas and/or RIE and oxidative ash/reductive ash. Moreover, it would be desirable to provide a selective cleaning composition and process, capable of removing residues such as etching and ashing residue, that exhibits high selectivity for the residue as compared to metals, high dielectric constant ("high k") materials (e.g., materials having a dielectric constant greater than 4.1), silicon, silicide and/or interlevel dielectric materials including low dielectric constant ("low k") materials (e.g., materials having a dielectric constant less than 4.0 or less than 3.5 or less than 3.0) such as deposited oxides that might also be exposed to the cleaning composition. It would be desirable to provide a composition that is compatible with and can be used with such sensitive low k or porous low k films as hydrogen silsequioxane (HSQ), methylsilsequioxane (MSQ), FOx, BLACK DIAMOND™ films manufactured by Applied Materials, Inc., and TEOS (tetraethylorthosilicate). In addition to the above, it would be desirable for a composition that is aqueous-based so that the disposal thereof will not harm the environment.

BRIEF SUMMARY OF THE INVENTION

The aqueous-based composition disclosed herein is capable of selectively removing residue such as, without limitation, post plasma etch, ash, or other residue from a substrate without attacking to any undesired extent metal, low k, and/or high k dielectric materials that might also be exposed to the composition. In addition, the composition disclosed herein may exhibit minimal etch rates of certain dielectric materials such as silicon oxide or metal lines or interlayers including copper. The cleaning compositions are substantially free of an added organic solvent which allows the semiconductor manufacture to reduce organic waste and the cost of ownership. In one aspect, there is provided a composition for removing residues from a substrate comprising: water; a quaternary ammonium hydroxide compound; a fluoride-containing compound; and optionally a corrosion inhibitor wherein the composition is substantially free of an added organic solvent and wherein the composition has a pH greater than 9.

Also disclosed herein is a method for removing residues including etching and/or ashing residue from a substrate that comprises contacting the substrate with the cleaning composition disclosed herein. In one aspect described herein, there is provided a method for defining a pattern comprising: coating a photoresist onto at least a portion of the substrate; lithographically defining a pattern on the photoresist; transferring the pattern onto at least a portion of the substrate; etching the pattern into the substrate to form a patterned substrate; exposing the patterned substrate to an activated reactive gas to remove at least a portion of the photoresist and provide a residue; and removing the residue by contacting the patterned substrate with a composition comprising: water; a quaternary ammonium hydroxide compound; a fluoride-containing compound; and optionally a corrosion inhibitor wherein the composition is substantially free of an added organic solvent and wherein the composition has a pH greater than 9.

In another aspect, there is provided a method for removing residues from a substrate comprising: contacting the substrate with a composition comprising: water; a quaternary ammonium hydroxide compound; a fluoride-containing compound; and optionally a corrosion inhibitor wherein the composition is substantially free of an added organic solvent and wherein the composition has a pH greater than 9.

DETAILED DESCRIPTION OF THE INVENTION

A composition and method comprising same for selectively removing residues such as, for example, processing residues such as the residues generated by etching, such as without limitation reactive ion etching, plasma etching, plasma ashing, or combinations thereof. The cleaning compositions disclosed are aqueous based and are substantially free, i.e., have 1% or less or 0.5% or less or 0.1% or less of an added organic solvent. The cleaning compositions are useful for removing residues from a substrate without corroding the underlying metal and dielectrics layers and while reducing the cost of ownership by eliminating the need for an added organic solvent.

The cleaning compositions comprise water; a quaternary ammonium hydroxide compound; a fluoride-containing compound; and optionally a corrosion inhibitor wherein the pH of the composition is greater than 9. In certain embodiments, the cleaning composition consists essentially of water;

a quaternary ammonium hydroxide compound; a fluoride-containing compound; and optionally a corrosion inhibitor and other components provided that these components do not adversely effect the cleaning performance of the composition nor damage the underlying substrate surface. In still other embodiments, the cleaning composition consists of water; a quaternary ammonium hydroxide; a fluoride-containing compound; and optionally a corrosion inhibitor.

In a cleaning method involving substrates useful for microelectronic devices, typical residues to be removed may include, for example, organic compounds such as exposed and/or ashed photoresist material, ashed photoresist residue, UV- or X-ray-hardened photoresist, C—F-containing polymers, low and high molecular weight polymers, and other organic etch residues; inorganic compounds such as metal oxides, ceramic particles from chemical mechanical planarization (CMP) slurries and other inorganic etch residues; metal containing compounds such as organometallic residues and metal organic compounds; ionic and neutral, light and heavy inorganic (metal) species, moisture, and insoluble materials, including particles generated by processing such as planarization and etching processes. In one particular embodiment, residues removed are processing residues such as those created by reactive ion etching, plasma etching, and/or plasma ashing.

The residues are typically present in a substrate that also includes metal, silicon, silicate and/or interlevel dielectric materials such as, for example, deposited silicon oxides and derivatized silicon oxides such as HSQ, MSQ, FOX, TEOS and spin-on glass, chemical vapor deposited dielectric materials, and/or high k materials such as hafnium silicate, hafnium oxide, barium strontium titanate (BST), $TiO_2$, $TaO_5$, wherein both the residues and the metal, silicon, silicide, interlevel dielectric materials, low k, porous low k, and/or high k materials will come in contact with the cleaning composition. The composition and method disclosed herein provide for selectively removing the residues such as photoresist, BARC, gap fill, and/or processing residues without significantly attacking the metal, silicon, silicon dioxide, interlevel dielectric materials, low k, porous low k, and/or high k materials. In certain embodiments, the substrate may contain a metal, such as, but not limited to, copper, copper alloy, titanium, titanium nitride, tantalum, tantalum nitride, tungsten, and/or titanium/tungsten alloys. In one embodiment, the composition disclosed herein may be suitable for substrates containing sensitive low k -films.

The composition disclosed herein contains from about 65% to about 99.9% by weight or from about 75% to about 98% by weight or from about 90% to about 98% by weight of water. It can be present incidentally as a component of other elements, such as for example, an aqueous solution comprising the fluoride-containing compound, or it can be added separately. Some non-limiting examples of water include deionized water, ultra pure water, distilled water, doubly distilled water, or deionized water having a low metal content.

The composition disclosed herein contains from about 0.5% to about 15% by weight or from about 1% to about 10% by weight or from about 1% to about 5% by of a quaternary ammonium hydroxide compounds. Exemplary quaternary ammonium hydroxides may be those compounds having the formula $[N-R_1R_2R_3R_4]^+OH^-$ wherein $R_1$, $R_2$, $R_3$, and $R_4$ are each independently an alkyl group, a hydroxyalkyl group, and combinations thereof. The term "alkyl" as used herein refers to straight or branched chain unsubstantiated hydrocarbon groups of 1 to 20 carbon atoms, or from 1 to 8 carbon atoms, or from 1 to 4 carbon atoms. Examples of suitable alkyl groups include methyl, ethyl, propyl, isopropyl, butyl, and tertbutyl. The expression "lower alkyl" refers to alkyl groups of 1 to 4 carbon atoms. The term "hydroxyalkyl" as used herein refers to straight or branched unsubstantiated hydroxyl groups containing hydrocarbon groups of from 1 to 20 carbon atoms, or from 1 to 8 carbon atoms, or from 1 to 4 carbon atoms. Examples of suitable hydroxylalkyl groups include hydroxylethyl and hydroxypropyl. Examples of suitable quaternary ammonium hydroxide compounds include tetramethylammounium hydroxide (TMAH), tetraethylammonium hydroxide, tetrabutylammonium hydroxide (TBAH), tetrapropylammonium hydroxide, trimethylethylammonium hydroxide, (2-hydroxyethyl)trimethylammonium hydroxide, (2-hydroxyethyl)triethylammonium hydroxide, (2-hydroxyethyl)tripropylammonium hydroxide, (1-hydroxypropyl)trimethylammonium hydroxide, ethyltrimethylammonium hydroxide, diethyldimethylammonium hydroxide and benzyltrimethylammonium hydroxide.

The composition described herein also contains a fluoride containing compound. The fluoride containing compound or mixture thereof is present in amounts of from about 0.1% to about 15% or from about 0.1 to about 10% or from about 0.2 to about 5% by weight based on the total weight of the composition. Fluoride containing compounds may include those of the general formula $R_5R_6R_7R_8NF$ where $R_5$, $R_6$, $R_7$, and $R_8$ are each independently hydrogen, an alcohol group, an alkoxy group, an alkyl group and mixtures thereof. Examples of such compounds include ammonium fluoride, tetramethyl ammonium fluoride, tetraethyl ammonium fluoride, tetrabutyl ammonium fluoride, and mixtures thereof. Still further examples of containing compound include fluoroboric acid, hydrofluoric acid, fluoroborates, fluoroboric acid, tetrabutylammonium tetrafluoroborate, aluminum hexafluoride, and choline fluoride. In still further embodiments, the containing compound is a fluoride salt of an aliphatic primary, secondary or tertiary amine can be used.

The composition disclosed herein may optionally contain from about 0 to about 15% by weight or from about 0.2% to about 10% by weight or from about 0.5% to about 5% by weight of a corrosion inhibitor. Any corrosion inhibitor known in the art for similar applications, such as those disclosed in U.S. Pat. No. 5,417,877 which are incorporated herein by reference may be used. Corrosion inhibitors may be, for example, an organic acid, an organic acid salt, a phenol, or a triazole. Examples of particular corrosion inhibitors include anthranilic acid, gallic acid, benzoic acid, isophthalic acid, maleic acid, fumaric acid, D,L-malic acid, malonic acid, phthalic acid, maleic anhydride, phthalic anhydride, benzotriazole (BZT), resorcinol, carboxybenzotriazole, diethyl hydroxylamine and the lactic acid and citric acid salts thereof, and the like. Further examples of corrosion inhibitors that may be used include catechol, pyrogallol, and esters of gallic acid. Yet other examples of suitable corrosion inhibitors include fructose, ammonium thiosulfate, glycine, lactic acid, tetramethylguanidine, iminodiacetic acid, and dimethylacetoacetamide. In certain embodiments, the corrosion inhibitors are mercapto-group containing compounds such as, but not limited to, 2-mercapto-5-methylbenzimidazole and 2-mercaptothiazoline. Still other examples of corrosion inhibitors include mercapto-group containing compounds which have a hydroxyl and/or carboxyl group on one side of the α- or β-position of the compound. Specific examples of these mercapto-group containing compounds include 3-mercapto-1,2-propanediol (which is also referred to as thioglycerol), 3-(2-aminophenylthio)-2-hydroxymercaptan, 3-(2-hydroxyethylthio)-2-hydroxypropylmercaptan, 2-mercaptopropionic acid, 3-mercaptoproponic acid, and mixtures thereof.

In certain embodiments, the composition disclosed herein may further comprise one or more additional components or additives provided that these additives do not adversely effect the cleaning performance of the composition nor damage the underlying substrate surface. Examples of these additives include without limitation surfactants, chelating agents, chemical modifiers, dyes, biocides, and/or other additives in amounts up to a total of about 5% by weight based on the total weight of the composition.

The compositions disclosed herein may have a pH that ranges from greater than 9 to about 14, or from greater than 9 to about 12.

The compositions disclosed herein are compatible with low k films such as, without limitation HSQ (FOx), MSQ, and SiLK™ which is manufactured by Dow Chemical, Inc., and other films. The formulations are also effective in stripping post-etched and/or post-ashed photoresists and plasma etch residues such as organic residues, organometallic residues, inorganic residues, metallic oxides, or photoresist complexes at low temperatures with relatively low corrosion of the underlying substrate such as, for example, those substrates containing copper, titanium, or both. Moreover, the compositions are compatible with a variety of low k, porous low k, and high k materials.

During the manufacturing process, a photoresist layer is coated on the substrate. Using photolithographic process, a pattern is defined on the photoresist layer. In certain embodiments, the patterned photoresist layer is subjected to plasma etch such as RIE by which the pattern is transferred to the substrate. The patterned photoresist layer is then removed by wet chemical means and/or dry removal processes (e.g., plasma etch, plasma ash, or both). In embodiments where RIE is used to transfer the pattern onto the substrate, the etch residues are generated prior to wet chemical and/or dry removal processes. If the substrates are not ashed, then the main residues to be cleaned are both etch residues and photoresist residues. In embodiments where the substrates are ashed, the main residues to be cleaned are ashed residues such as ashed photoresists and etch residues if an etch step is conducted.

The method described herein may be conducted by contacting a substrate having a metal, organic or metal-organic polymer, inorganic salt, oxide, hydroxide, or complex or combination thereof present as a film or residue, with the described composition. The actual conditions, e.g., temperature, time, etc., depend on the nature and the thickness of the residues to be removed. In general, the substrate is contacted or dipped into a vessel containing the composition at a temperature ranging from 20° C. to 85° C., or from 20° C. to 60° C., or from 20° C. and 40° C. Typical time periods for exposure of the substrate to the composition may range from, for example, 0.1 to 60 minutes, or 1 to 30 minutes, or 1 to 15 minutes. After contact with the composition, the substrate may be rinsed and then dried. Drying is typically carried out under an inert atmosphere. In certain embodiments, a deionized water rinse or rinse containing deionized water with other additives may be employed before, during, and/or after contacting the substrate with the composition described herein. However, the composition can be used in any method known in the art that utilizes a cleaning fluid for the removal of post-etched and/or post-ashed photoresist, ash or etch residues and/or other residues.

EXAMPLES

The following examples are provided to further illustrate the composition and method disclosed herein. Examples of the various exemplary compositions and pH levels for each composition are set forth in Table I. In Table I, all amounts are given in weight percent and add up to 100 weight percent. The compositions disclosed herein were prepared by mixing the components together in a vessel at room temperature until all solids have dissolved. In the examples below, pH determinations were made using 5% aqueous solutions at ambient temperature. The substrates were coated with a positive resist that was developed, etched and ashed prior to exposure prior to exposure to the composition. In the following tables, "N.T." indicates not tested and "n.a." indicates not available.

Table II illustrates the effectiveness of various exemplary compositions for removing residues from silicon wafer test substrates. The wafers had a low k, silicon oxide-containing film such as JSR LKD-5109™ p-MSQ films provided by JSR, Inc., a titanium nitride barrier layer, a copper metallization layer a titanium nitride barrier layer, a copper metallization layer, a BARC layer, and a photoresist pattern which was etched and ashed using a plasma etching and ashing process. The substrates were then processed by immersing the substrate in a variety of exemplary compositions. In this procedure, one or more test wafers were placed in a 600 milliliter (ml) beaker that contained 400 mls of each exemplary composition. The 600 ml beaker further included a 1 inch stir bar that rotated at 400 revolutions per minute. The exemplary compositions having the wafer(s) contained therein were then heated at the time and temperature provided in Table II. After exposure to the exemplary composition, the wafer(s) were rinsed with deionized water and dried with nitrogen gas. The wafers were cleaved to provide an edge and then examined using scanning electron microscopy (SEM) on a variety of pre-determined locations on the wafer and the results of the cleaning performance and damage to the underlying interlayer dielectric (ILD) were visually interpreted and coded as provided in Table II in following manner: for cleaning "+++" indicates excellent, "++" indicates good; "+" indicates fair; and "−" indicates poor and for ILD damage "++" indicates no damage, "+" indicates little damage, and "−" indicates severe damage.

The summary of copper etch rates were obtained from various silicon wafer substrates having a layer of copper deposited thereupon are provided in Table III. In all of the following etch rates, measurements were conducted at 5, 10, 20, 40, and 60 minutes of exposure. Thickness measurements were determined at each time interval and graphed using a "least squares fit" model on the results for each exemplary composition. The calculated slope of the "least squares fit" model of each composition is the resultant etch rate provided in angstroms/minute (Å/min). In determining the etch rates, the wafers had a blanker layer of a known thickness of copper deposited upon it. The initial thickness of the wafer was determined using the CDE ResMap 273 Four Point Probe. After determining the initial thickness, test wafers were immersed in the exemplary compositions. After five minutes, the test wafers were removed from the test solution, rinsed for three minutes with deionized water and completely dried under nitrogen. The thickness of each wafer was measured and if necessary the procedure was repeated on the test wafer.

The summary of etch rates on blanket silicon wafers containing copper, densified, doped tetraethylorthosilicate (TEOS), and JSR LEB-043™ which is a porous methylsilsequioxane (MSQ) film are provided in Table III. In all of the following etch rates, measurements were conducted at 5, 10, 20, 40, and 60 minutes of exposure at the temperature intervals specified in Table III. Thickness measurements were determined at each time interval and graphed using a "least squares fit" model on the results for each exemplary composition. The calculated slope of the "least squares fit" model of each composition is the resultant etch rate provided in angstroms/minute (Å/min). In determining either the copper etch rate or TEOS etch rate, the wafers had a blanker layer of a known thickness deposited upon it. For Cu etch rate, the initial thickness of the wafer was determined using the CDE ResMap 273 Four Point Probe. After determining the initial thickness, test wafers were immersed in the exemplary compositions. After five minutes, the test wafers were removed from the test solution, rinsed for three minutes with deionized water and completely dried under nitrogen. The thickness of each wafer was measured and if necessary the procedure was repeated on the test wafer. For TEOS and JSR LEB-043™ film etch rate, the initial thickness was determined using a FilmTek 2000 SE Spectroscopic Ellipsometer/Reflectomer. Approximately 200 mls of a test solution was placed in a 250 ml beaker with stirring and heated, if required, to the specified temperature. If only one wafer was placed in a beaker containing solution a dummy wafer was placed in the beaker. After five minutes, each test wafer was washed with deionized water for three minutes and dried under nitrogen. Prior to thickness measurement, the TEOS and JSR LEB-043™ wafers were baked at a temperature of 110° C. for approximately 10 minutes. Measurements of each wafer were taken and if necessary the procedure was repeated.

TABLE I

Composition

| Example 1 | | Example 2 | | Example 3 | | Example 4 | |
|---|---|---|---|---|---|---|---|
| DIW | 90 | DIW | 89 | DIW | 89 | DIW | 89 |
| TMAH (25%) | 7.5 | TMAH (25%) | 8 | TMAH (25%) | 7.5 | TMAH (25%) | 7.5 |
| TMAF (20%) | 2.5 | TMAF (20%) | 3 | TMAF (20%) | 2.5 | TMAF (20%) | 2.5 |
| | | | | Malonic Acid | 1 | Thioglycerol | 1 |
| pH | 11.92 | pH | 11.55 | pH | 10.66 | pH | 11.67 |

| Example 5 | | Example 6 | | Example 7 | | Example 8 | |
|---|---|---|---|---|---|---|---|
| DIW | 82.5 | DIW | 77.5 | DIW | 76.5 | DIW | 81.5 |
| TMAH (25%) | 15 | TMAH (25%) | 20 | TMAH (25%) | 20 | TMAH (25%) | 15 |
| TMAF (20%) | 2.5 | TMAF (20%) | 2.5 | TMAF (20%) | 2.5 | TMAF (20%) | 2.5 |
| | | | | Thioglycerol | 1 | Thioglycerol | 1 |
| pH | 11.82 | pH | 11.99 | pH | 12.07 | pH | 11.88 |

DIW deionized water
TMAH tetramethylammonium hydroxide, 25% aqueous solution
TMAF tetramethylammonium fluoride, 20% aqueous solution

TABLE II

SEM Data

| | | | Cu/JSR LKD-5109 ™ | | Cu/pJSR LKD-5109 ™ | |
|---|---|---|---|---|---|---|
| | Temp. (° C.) | Time (min.) | Clean | ILD damage | Clean | ILD damage |
| Ex. 1 | 25 | 30 | ++ | ++ | − | ++ |
| | 40 | 15 | +++ | ++ | +++ | − |
| Ex. 2 | 25 | 30 | − | +++ | +++ | − |
| | 40 | 15 | − | +++ | +++ | − |
| Ex. 3 | 25 | 30 | ++ | ++ | +++ | ++ |
| | 40 | 15 | +++ | ++ | +++ | ++ |

TABLE II-continued

SEM Data

| | | | Cu/JSR LKD-5109 ™ | | Cu/pJSR LKD-5109 ™ | |
|---|---|---|---|---|---|---|
| | Temp. (° C.) | Time (min.) | Clean | ILD damage | Clean | ILD damage |
| Ex. 4 | 25 | 30 | +++ | +++ | +++ | ++ |
| | 40 | 5 | +++ | +++ | N.T. | N.T. |
| | 40 | 15 | +++ | +++ | +++ | ++ |

TABLE III

Etch Rate Data

| Formulation | Copper (25° C.) | Copper (40° C.) | TEOS (doped, undensified) (25° C.) | TEOS (doped, undensified) (40° C.) | JSR LEB-043 ™ (25° C.) |
|---|---|---|---|---|---|
| Example 1 | 4 | 4 | <1 | <1 | N.T. |
| Example 2 | 2 | 7 | <1 | <1 | N.T. |
| Example 3 | <1 | 4 | <1 | <1 | <1 |
| Example 4 | 1 | 2 | <1 | <1 | <1 |
| Example 5 | 2 | N.T. | <1 | N.T. | N.T. |
| Example 6 | 4 | N.T. | <1 | N.T. | N.T. |
| Example 7 | 1 | N.T. | <1 | N.T. | N.T. |
| Example 8 | 1 | N.T. | <1 | N.T. | N.T. |

The invention claimed is:

1. A composition for removing residues from a substrate, the composition consisting of:
   water;
   a quaternary ammonium hydroxide compound comprising a compound having a general formula $[N-R_1R_2R_3R_4]^+$ $OH^-$ wherein $R_1$, $R_2$, $R_3$, and $R_4$ are each independently an alkyl group, a hydroxyalkyl group, and mixtures thereof;
   a fluoride containing compound comprising at least one selected from the group consisting of a compound having a general formula $R_5R_6R_7R_8NF$ where $R_5$, $R_6$, $R_7$ and $R_8$ are each independently hydrogen, an alcohol group, an alkoxy group, an alkyl group, and mixtures thereof; hydrofluoric acid; choline fluoride; aluminum hexafluoride; fluoride salt of an amine; and mixtures thereof;
   optionally a corrosion inhibitor selected from the group consisting of an organic acid, an organic acid salt, catechol, resorcinol, a phenol, maleic anhydride, phthalic anhydride, pyrogallol, gallic acid or esters thereof, benzotriazole, carboxybenzotriazole, diethylhydroxlamine, fructose, ammonium thiosulfate, glycine, tetramethylguanidine, iminodiacetic acid, thioglycerol, triazole, dimethylacetamide, mercapto-group containing compound and combinations thereof; and
   optionally an additive selected from the group consisting of a surfactant, a chelating agent, a dye, a biocide, and combinations thereof,
   wherein the composition is free of an added organic solvent and
   wherein the composition has a pH greater than 9.

2. The composition of claim 1 comprising the corrosion inhibitor.

3. The composition of claim 1 wherein the quaternary ammonium hydroxide compound is selected from the group consisting of tetramethylammonium hydroxide, tetraethylammonium hydroxide, tetrapropylammonium hydroxide, tetrabutylammonium hydroxide, trimethylethylammonium hydroxide, (2-hydroxyethyl)trimethylammonium hydroxide, (2-hydroxyethyl)triethylammonium hydroxide, (2-hydroxyethyl)tripropylammonium hydroxide, (1-hydroxypropyl)trimethylammonium hydroxide, and mixtures thereof.

4. The composition of claim 1 wherein the fluoride containing compound comprises the compound having the general formula $R_5R_6R_7R_8NF$ where $R_5$, $R_6$, $R_7$ and $R_8$ are each independently hydrogen, an alcohol group, an alkoxy group, an alkyl group, and mixtures thereof.

5. The composition of claim 4 wherein the fluoride containing compound is selected from tetramethyl ammonium fluoride, tetraethyl ammonium fluoride, tetrabutyl ammonium fluoride, choline fluoride, and mixtures thereof.

6. The composition of claim 1 wherein the fluoride containing compound is selected from hydrofluoric acid, choline fluoride; aluminum hexafluoride; fluoride salt of an amine, and mixtures thereof.

7. A method for defining a pattern comprising the steps of:
coating a photoresist onto a substrate,
lithographically defining a pattern on the photoresist;
transferring the pattern onto at least a portion of the substrate;
etching the pattern into the substrate to form a patterned substrate;
exposing the patterned substrate to an activated reactive gas to remove at least a portion of the photoresist and provide a residue;
removing the residue from the substrate by contacting the substrate with a composition consisting of:
water;
a quaternary ammonium hydroxide compound comprising a compound having a general formula $[N-R_1R_2R_3R_4]^+ OH^-$ wherein $R_1$, $R_2$, $R_3$, and $R_4$ are each independently an alkyl group, a hydroxyalkyl group, and mixtures thereof;
a fluoride containing compound comprising at least one selected from the group consisting of a compound having a general formula $R_5R_6R_7R_8NF$ where $R_5$, $R_6$, $R_7$ and $R_8$ are each independently hydrogen, an alcohol group, an alkoxy group, an alkyl group, and mixtures thereof; hydrofluoric acid; choline fluoride; aluminum hexafluoride; fluoride salt of an amine; and mixtures thereof;
optionally a corrosion inhibitor selected from the group consisting of an organic acid, an organic acid salt, catechol, resorcinol, a phenol, maleic anhydride, phthalic anhydride, pyrogallol, gallic acid or esters thereof, benzotriazole, carboxybenzotriazole, diethylhydroxlamine, fructose, ammonium thiosulfate, glycine, tetramethylguanidine, iminodiacetic acid, thioglycerol, triazole, dimethylacetamide, mercapto-group containing compound and combinations thereof; and
optionally an additive selected from the group consisting of a surfactant, a chelating agent, a dye, a biocide, and combinations thereof,
wherein the composition is substantially free of an added organic solvent and wherein the composition has a pH greater than 9.

8. A method for removing residues from a substrate comprising: contacting the substrate with a composition consisting of:
from 65 to 99.9% by weight of water;
from 0.5 to 15% by weight of a quaternary ammonium hydroxide compound comprising a compound having a general formula $[N-R_1R_2R_3R_4]^{+OH-}$ wherein $R_1$, $R_2$, $R_3$, and $R_4$ are each independently an alkyl group, a hydroxyalkyl group, and mixtures thereof;
from 0.1 to 10% by weight of a fluoride-containing compound comprising at least one selected from the group consisting of a compound having a general formula $R_5R_6R_7R_8NF$ where $R_5$, $R_6$, $R_7$ and $R_8$ are each independently hydrogen, an alcohol group, an alkoxy group, an alkyl group, and mixtures thereof; hydrofluoric acid; choline fluoride; aluminum hexafluoride; fluoride salt of an amine; and mixtures thereof;
and optionally from 0 to 10% by weight a corrosion inhibitor selected from the group consisting of an organic acid, an organic acid salt, catechol, resorcinol, a phenol, maleic anhydride, phthalic anhydride, pyrogallol, gallic acid or esters thereof, benzotriazole, carboxybenzotriazole, diethylhydroxlamine, fructose, ammonium thiosulfate, glycine, tetramethylguanidine, iminodiacetic acid, thioglycerol, triazole, dimethylacetamide, mercapto-group containing compound and combinations thereof; and
optionally from 0 to about 5% by weight of an additive selected from the group consisting of a surfactant, a chelating agent, a dye, a biocide, and combinations thereof,
wherein the composition is substantially free of an added organic solvent and wherein the composition has a pH greater than 9.

9. The composition of claim 1 consisting of:
from 65 to 99.9% by weight of the water;
from 0.5 to 15% by weight of the quaternary ammonium hydroxide compound;
from 0.1 to 10% by weight of the fluoride-containing compound;
optionally from 0 to 10% by weight the corrosion inhibitor; and
optionally from 0 to about 5% by weight of the additive.

10. The composition of claim 9 wherein the composition comprises the corrosion inhibitor.

11. The composition of claim 9 wherein the quaternary ammonium hydroxide compound is selected from the group consisting of tetramethylammonium hydroxide, tetraethylammonium hydroxide, tetrapropylammonium hydroxide, tetrabutylammonium hydroxide, trimethylethylammonium hydroxide, (2-hydroxyethyl)trimethylammonium hydroxide, (2-hydroxyethyl)triethylammonium hydroxide, (2-hydroxyethyl)tripropylammonium hydroxide, (1-hydroxypropyl)trimethylammonium hydroxide, and mixtures thereof.

12. The composition of claim 10 wherein the quaternary ammonium hydroxide compound is selected from the group consisting of tetramethylammonium hydroxide, tetraethylammonium hydroxide, tetrapropylammonium hydroxide, tetrabutylammonium hydroxide, trimethylethylammonium hydroxide, (2-hydroxyethyl)trimethylammonium hydroxide, (2-hydroxyethyl)triethylammonium hydroxide, (2-hydroxyethyl)tripropylammonium hydroxide, (1-hydroxypropyl)trimethylammonium hydroxide, and mixtures thereof.

13. The composition of claim 11 wherein the fluoride containing compound comprises the compound having the general formula $R_5R_6R_7R_8NF$ where $R_5$, $R_6$, $R_7$ and $R_8$ are each independently hydrogen, an alcohol group, an alkoxy group, an alkyl group, and mixtures thereof.

14. The composition of claim 12 wherein the fluoride containing compound comprises the compound having the general formula $R_5R_6R_7R_8NF$ where $R_5$, $R_6$, $R_7$ and $R_8$ are each independently hydrogen, an alcohol group, an alkoxy group, an alkyl group, and mixtures thereof.

15. The composition of claim 13 wherein the fluoride containing compound is selected from tetramethyl ammonium fluoride, tetraethyl ammonium fluoride, tetrabutyl ammonium fluoride, choline fluoride, and mixtures thereof.

16. The composition of claim 14 wherein the fluoride containing compound is selected from tetramethyl ammonium fluoride, tetraethyl ammonium fluoride, tetrabutyl ammonium fluoride, choline fluoride, and mixtures thereof.

17. The composition of claim 11 wherein the fluoride containing compound comprises hydrofluoric acid, choline fluoride, aluminum hexafluoride, fluroide salt of an amine, or mixtures thereof.

18. The composition of claim 12 wherein the fluoride containing compound comprises hydrofluoric acid, choline fluoride; aluminum hexafluoride, fluroide salt of an amine, or mixtures thereof.

19. The composition of claim 9 wherein the composition comprises the additive.

20. The composition of claim 10 wherein the composition comprises the additive.

\* \* \* \* \*